United States Patent
Zhang et al.

(10) Patent No.: US 10,897,310 B2
(45) Date of Patent: Jan. 19, 2021

(54) OPTICAL LINE TERMINAL AND METHOD FOR TRANSMITTING DIGITAL INFORMATION

(71) Applicant: CABLE TELEVISION LABORATORIES, INC., Louisville, CO (US)

(72) Inventors: Haipeng Zhang, Broomfield, CO (US); Zhensheng Jia, Superior, CO (US); Mu Xu, Broomfield, CO (US)

(73) Assignee: CABLE TELEVISION LABORATORIES, INC., Louisville, CO (US)

( * ) Notice: Subject to any disclaimer, the term of this patent is extended or adjusted under 35 U.S.C. 154(b) by 0 days.

(21) Appl. No.: 16/453,848

(22) Filed: Jun. 26, 2019

(65) Prior Publication Data
US 2019/0393962 A1    Dec. 26, 2019

Related U.S. Application Data

(60) Provisional application No. 62/689,960, filed on Jun. 26, 2018.

(51) Int. Cl.
*H04B 10/27* (2013.01)
*H04J 14/02* (2006.01)
(Continued)

(52) U.S. Cl.
CPC .............. *H04B 10/27* (2013.01); *G02F 1/21* (2013.01); *H01S 5/041* (2013.01); *H01S 5/0657* (2013.01);
(Continued)

(58) Field of Classification Search
CPC ... H04B 10/27; H04B 10/505; H04J 14/0227; H04J 14/08; H01S 5/041; H01S 5/0657; G02F 2001/212; G02F 1/21
(Continued)

(56) References Cited

U.S. PATENT DOCUMENTS 10,454,587 B2 * 10/2019 Schmogrow ............ H04J 14/02
2004/0264977 A1 * 12/2004 Yap ........................... G02F 2/02
398/161

(Continued)

FOREIGN PATENT DOCUMENTS

WO    WO-2005104310 A1 * 11/2005 ............. H01S 3/108
WO    WO-2019173621 A1 *  9/2019 ............. G02F 1/353

*Primary Examiner* — Dalzid E Singh
(74) *Attorney, Agent, or Firm* — Lathrop GPM LLP (57) ABSTRACT

An optical line terminal includes an optical comb generator, N downlink channels $D_k$, and N uplink-photodetectors $PD_k$. The optical comb generator is configured to generate a carrier signal having an optical-frequency-comb spectrum and including N optical tones $T_k$ and N optical tones $R_k$, k={1, 2, ..., N}. Each of the N downlink channels $D_k$ is optically coupled to the optical comb generator and is configured to generate a respective downlink signal $DS_k$ that includes optical tone $T_k$ modulated by downlink data. Each of the N uplink-photodetectors $PD_k$ is configured to receive a respective one of a plurality of modulated uplink signals $US_k$, having optical tone $R_k$ as a carrier signal.

18 Claims, 4 Drawing Sheets

(51) Int. Cl.
*H04J 14/08* (2006.01)
*G02F 1/21* (2006.01)
*H01S 5/04* (2006.01)
*H01S 5/065* (2006.01)
*H04B 10/50* (2013.01)

(52) U.S. Cl.
CPC ........ *H04B 10/505* (2013.01); *H04J 14/0227* (2013.01); *H04J 14/08* (2013.01); *G02F 2001/212* (2013.01)

(58) Field of Classification Search
USPC .......................................................... 398/79
See application file for complete search history.

(56) References Cited

U.S. PATENT DOCUMENTS

| | | | |
|---|---|---|---|
| 2010/0215368 A1* | 8/2010 | Qian | H04J 14/0252 398/67 |
| 2012/0251129 A1* | 10/2012 | Delfyett | H01S 5/0656 398/188 |
| 2017/0294966 A1* | 10/2017 | Jia | H04J 14/06 |
| 2019/0013869 A1* | 1/2019 | Alic | G02F 1/39 |

\* cited by examiner

OPTICAL LINE TERMINAL AND METHOD FOR TRANSMITTING DIGITAL INFORMATION

CROSS-REFERENCE TO RELATED APPLICATION

This application claims priority to U.S. provisional patent application Ser. No. 62/689,960, filed on Jun. 26, 2018, the disclosure of which is incorporated herein by reference in its entirety.

BACKGROUND

Passive optical networks (PON) have evolved greatly and rapidly over the last two decades and represent one of the most attractive access network solutions for delivering high-speed data and video services. Each of first generation BPONs (Broadband Passive Optical Networks), GPONs (Gigabit Passive Optical Networks), and EPON (Ethernet Passive Optical Networks) relied on relatively basic and relaxed specifications on the components. PON standards have since evolved into 10 Gbit/s Ethernet PON and 10-Gigabit-capable PON (XG-PON) with tightened tolerances. More recently, the Next-Generation PON 2 (NG-PON2) and 100G-EPON, which are the migration from current deployed PON standard systems such as G-PON and E-PON, are aimed at supporting increasing bandwidth demands. In this sense, time-division multiplexing (TDM) and wavelength division multiplexing (WDM) have been utilized to balance the cost and performance flexibility path, and thus multiple single-mode optical light sources are required for this type of PON architectures at high cost. However, due to the continued growth of various end-user demands and highly time-varying traffic, other degrees of flexibility will be required.

SUMMARY OF THE EMBODIMENTS

An optical line terminal includes an optical comb generator, N downlink channels $D_k$, and N uplink-photodetectors $PD_k$. The optical comb generator is configured to generate a carrier signal having an optical-frequency-comb spectrum and includes N optical tones $T_k$ and N optical tones $R_k$, k={1, 2, . . . , N}. Each of the N downlink channels $D_k$ is optically coupled to the optical comb generator and is configured to generate a respective downlink signal $DS_k$ that includes optical tone $T_k$ modulated by downlink data. Each of the N uplink-photodetectors $PD_k$ is configured to receive a respective one of a plurality of modulated uplink signals $US_k$, having optical tone $R_k$ as a carrier signal.

DETAILED DESCRIPTION OF THE EMBODIMENTS

Key requirements for the next generation optical access networks include data rate of up to multi-Gb/s per user, relatively long reach of sixty to one hundred kilometers and a high splitting factor of up to one thousand. To meet such high capacity demands, coherent optical access technology has gained increasing attention due to its superior performance and potential cost reductions.

Compared with current PON standards, which heavily rely on intensity modulation of light with data rate restricted by electrical analog bandwidth, the coherent solution takes advantage of combing the optical amplitude, phase, and polarization to encode information. This introduces a significant increase in the data rate without requiring super high-speed analog electronics. However, due to the requirement of advanced laser sources (narrow linewidth tunable laser) for both coherent transmitters and receivers, and high-performance DSP (Digital Signal Processing), the cost is usually prohibitive for implementing existing long-haul coherent solutions in the optical access networks. Furthermore, as coherent PON technology approaches dense WDM architecture, a large number of high-quality laser sources are required, which further increases costs.

To address the high cost issue mentioned above for NG-PON2, 100G-EPON, and coherent PON, embodiments disclosed herein include PON architectures based on gain-switched optical frequency comb generation combined with OIL (optical injection locking) technologies. By utilizing a gain-switched optical frequency comb laser system as downlink light source, and optical injection locked FP (Fabry-Perot) laser diodes as up-link light sources and local oscillators in a coherent PON or NG-PON2/100G-EPON system, laser cost can be reduced significantly. Furthermore, the tunable free-spectral-range of the optical frequency comb source, in conjunction with the tunable operating wavelength of both the comb source, the local oscillator, and the up-link OIL laser makes the system highly flexible for various network requirements.

Optical Injection Locking

Since a semiconductor laser can be locked to frequency and phase of an externally injected optical signal, a low cost multi-mode FP laser diode can be turned into single-mode operation by injecting a high-quality single-mode signal into its cavity. An OIL apparatus 100 is illustrated schematically in FIG. 1. OIL apparatus 100 includes at least one of a master laser 110, a polarization controller 114, an optical circulator 120, and a slave laser 130.

Figure 1:
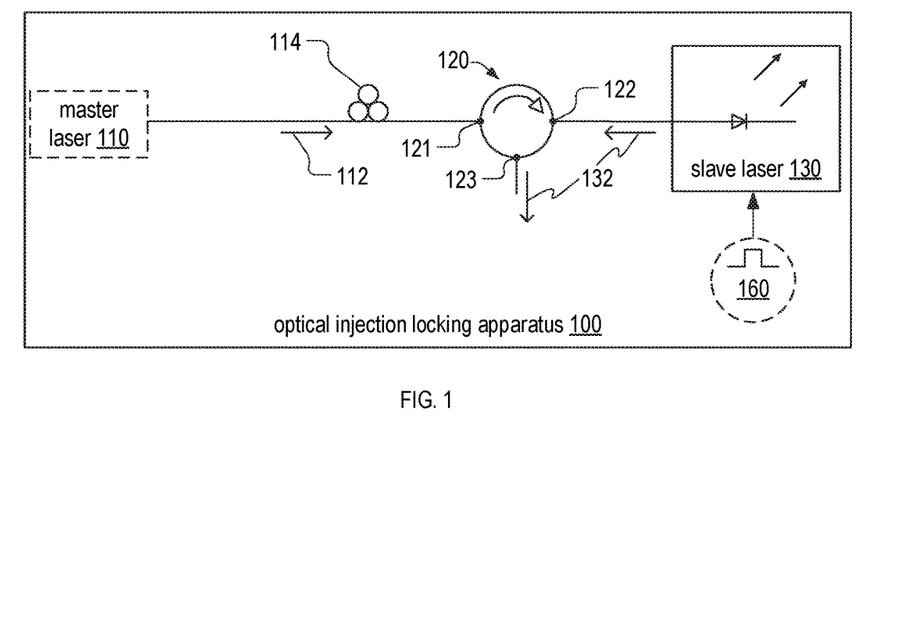
FIG. 1 is a schematic of an optical injection locking (OIL) apparatus, in an embodiment.

Master laser 110 may be a tunable external-cavity laser with C-band coverage, which satisfies optical networking requirements for a narrow frequency linewidth light source in a coherent system. In embodiments, the optical output power of master laser 110 is at least 6 dBm, and its frequency linewidth is less than 100 kHz. In embodiments, slave laser 130 includes a semiconductor laser diode, and may be a Fabry-Perot laser or a vertical cavity surface-emitting laser. Slave laser 130 may be in a transistor outline package. In embodiments, the cavity length of slave laser 130 is between 625 μm and 675 μm. Optical circulator 120 may be three-port optical circulator that includes ports 121, 122, and 123.

Master laser 110 outputs an optical signal 112, the wavelength of which may be tuned to match a longitudinal mode of slave laser 130. Master laser 110 externally injects optical signal 112 into slave laser 130 via optical circulator 120. When a DC bias is applied to slave laser 130 and gradually increased, one of the longitudinal modes (and hence a corresponding mode wavelength) of slave laser 130 is injection locked to master laser 110, while other modes are suppressed. Consequently, slave laser 130 emits output optical signal 132, which enters port 122 and exits port 123 of optical circulator 120, and single-mode operation of slave laser 130 is achieved at the mode wavelength. With its narrow spectral linewidth inherited from master laser 110, injection-locked slave laser 130 may be used as a coherent light source or local oscillator in the coherent system. Polarization controller 114 is configured to control the polarization of optical signal 112.

In embodiments, OIL apparatus 100 includes a signal generator 160. Signal generator 160 is configured to directly modulate slave laser 130 per an input signal received by OIL apparatus 100, such that output optical signal 132 is modulated with data transmitted by the input signal.

Gain-Switched Optical Frequency Comb Generation

Gain switching is a modulation technique for short optical pulse generation that has been used to generate an optical frequency comb. A semiconductor laser diode, such as one present in slave laser 130, driven by RF current pulses from an electrical comb generator or a sinusoidal synthesizer, can generate very short optical pulses if injection locked by a narrow line-width master laser. Compared with other optical frequency comb generation technologies via use of a mode-locked laser, a quantum dot laser, or electro-optical modulation, an advantage of gain switching comb generation is that it can utilize standard off-the-shelf components to ensure low cost while still achieving good performance.

Figure 2:
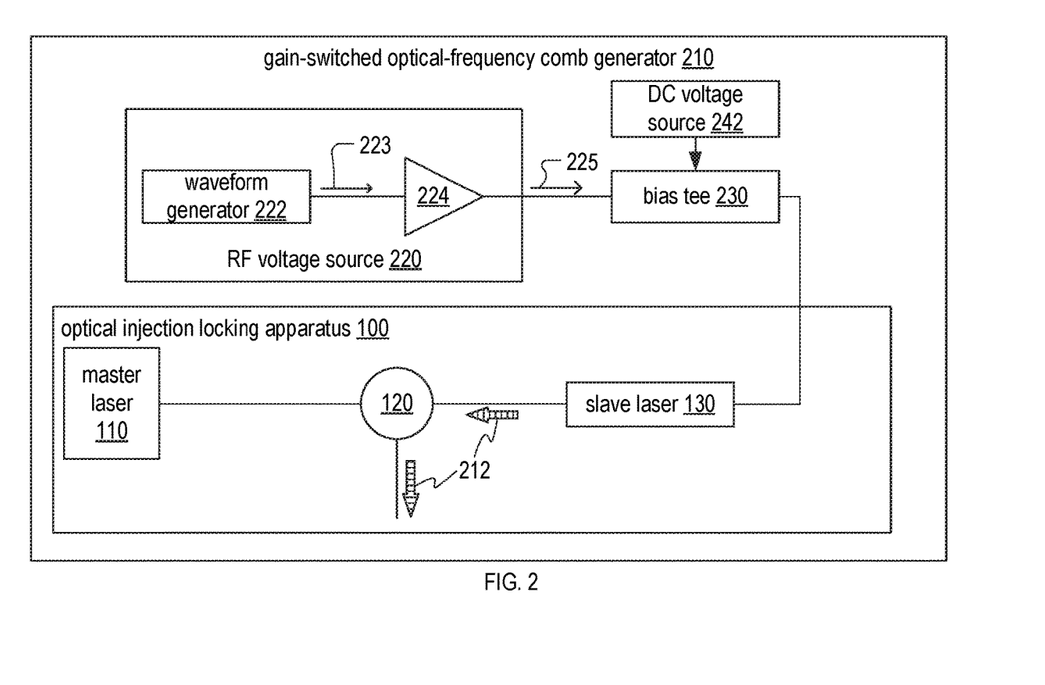
FIG. 2 is a schematic of a gain-switched optical-frequency comb generator that includes the OIL apparatus of FIG. 1, in an embodiment.

FIG. 2 is a schematic of a gain-switched optical-frequency comb generator 210 that outputs a carrier signal 212 via gain switching and optical injection locking. The optical spectrum of carrier signal 212 is an optical-frequency-comb.

Comb generator 210 includes OIL apparatus 100, an RF voltage source 220, a bias tee 230, and a DC voltage source 242. RF voltage source 220 includes a waveform generator 222, a radio-frequency amplifier 224, which amplifies a signal 223 output by waveform generator 222 before it is received by bias tee 230 as an amplified signal 225. Slave laser 130 is biased via bias tee 230 with a combination of DC voltage source 242 and RF voltage source 220. In an embodiment, slave laser 130 is gain-switched with a 24-dBm RF sinusoidal signal at 10 GHz (amplified signal 225), combined with a 40-mA current from DC voltage source 242. In this embodiment, carrier signal 212 includes five to eight clearly resolved 10-GHz tones. Comb generator 210 may also include an additional phase modulator, which enables generation of additional tones, such that the optical frequency comb of carrier signal 212 includes fourteen to sixteen clearly resolved tones.

Figure 3:
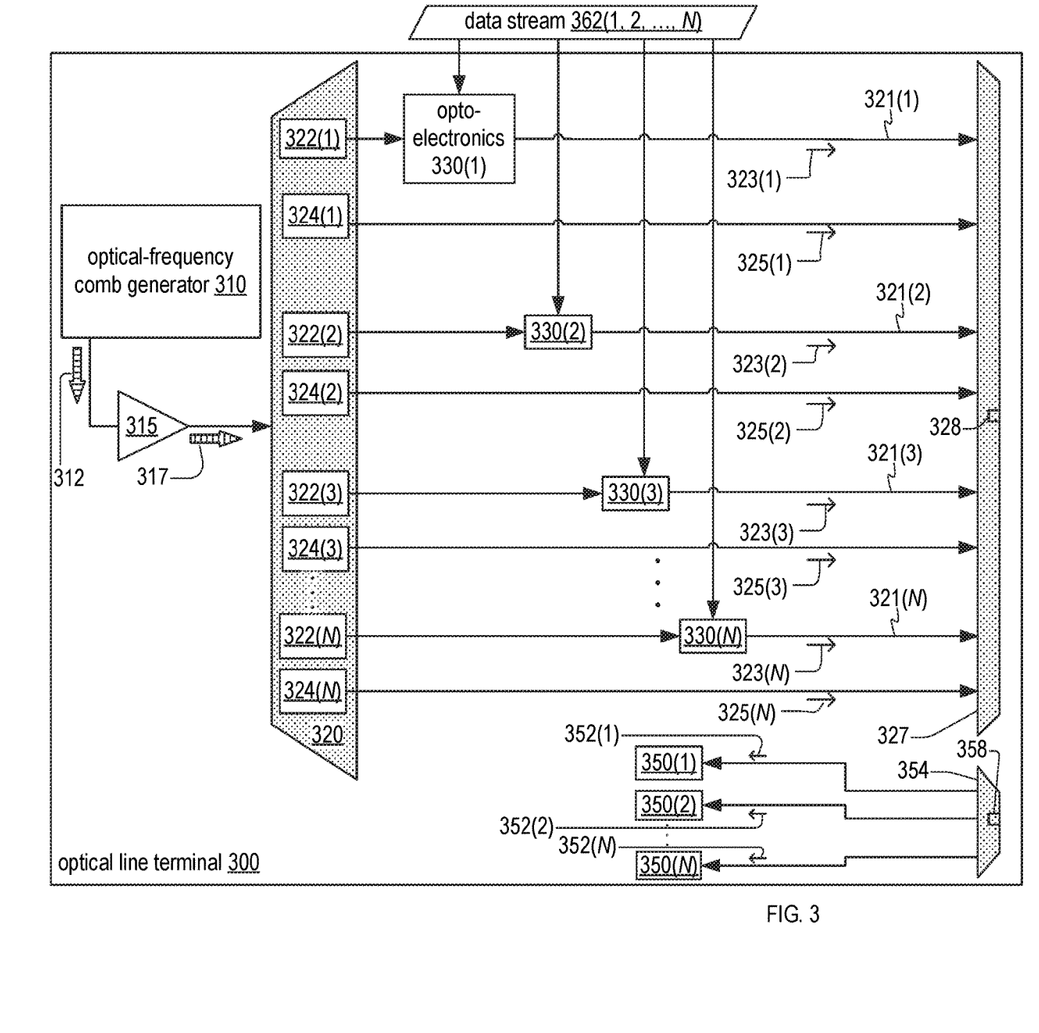
FIG. 3 is a schematic of an optical line terminal (OLT), which, in embodiments, includes an OIL apparatus of FIG. 1.

FIG. 3 is a schematic of an optical line terminal (OLT) 300. OLT 300 includes an optical comb generator 310, N downlink channels 322(1, 2, . . . , N), and N uplink-photodetectors 350(1, 2, . . . , N). Optical comb generator 310 is configured to generate a carrier signal 312 having an optical-frequency-comb spectrum that includes N optical tones $T_k$ and N optical tones $R_k$, where k is a positive integer less than or equal to N. Optical comb generator 210 and carrier signal 212, FIG. 2, are examples of optical comb generator 310 and carrier signal 312, respectively. In embodiments, the 2N tones of optical-frequency-comb spectrum, in order of monotonically increasing frequency or monotonically decreasing frequency, are either (i) $\{T_1, R_1, T_2, R_2, T_3, R_3, \ldots, T_N, R_N\}$ or $\{R_1, T_1, R_2, T_2, R_3, T_3, \ldots, R_N, T_N\}$.

Each downlink channel 322(k) is optically coupled to optical comb generator 310 and configured to generate a respective downlink signal 323(k) that includes optical tone $T_k$ modulated by downlink data stream 362(k). In embodiments, each downlink channel 322(k) includes a respective optoelectronics 330(k) that modulates optical tone $T_k$ with downlink data stream 362(k) to produce downlink signal 323(k). Downlink data stream 362 may be modulated per amplitude shift-keying modulation, such as on-off keying, and may be a non-return-to-zero (NRZ) signal type. Each optoelectronics 330(k) is optically coupled to a respective input port of multiplexer 327 by a respective optical fiber 321(k).

OLT 300 includes N uplink channels 324(1, 2, . . . , N), each of which is coupled to optical comb generator 310 and configured carry a respective optical tone $R_k$ as part of an uplink carrier 325(1, 2, . . . , N). Each uplink-photodetector 350 is configured to receive a respective one of a plurality of modulated uplink signals 352(1-N) having a respective optical tone $R_k$ as a carrier signal. For example, optical tone $R_k$ is the carrier signal for modulated uplink signal 352(k). In embodiments, each modulated uplink signal 352(k) is uplink carrier 325(k) modulated with a respective uplink data stream received by an optical network unit or optical network terminal that receives uplink carrier 325(k). Modulated uplink data signals 352 may be modulated per amplitude shift-keying modulation, such as on-off keying, and may be a non-return-to-zero (NRZ) signal type. Each uplink data stream may originate within a respective computing device communicatively connected to the optical network unit.

In embodiments, OLT 300 includes a demultiplexer 354. Demultiplexer 354 has an input port 358 configured to receive uplink signals 352 and N output ports each optically coupled to a respective one of the N uplink-photodetectors 350. In embodiments, at least one of demultiplexer 320, multiplexer 327, and demultiplexer 354 is, or includes, an arrayed waveguide grating.

In embodiments, OLT 300 includes an amplifier 315, which receives and amplifies carrier signal 312, and outputs an amplified version of signal 312 as an optical signal 317. In embodiments, OLT 300 lacks amplifier 315, and optical signals 317 is identical to carrier signal 312. Amplifier 315 may be an erbium-doped fiber amplifier or a semiconductor amplifier.

OLT 300 includes a demultiplexer 320 and a multiplexer 327. Demultiplexer 320 receives optical signal 317 via an input port optically coupled to comb generator 310. Demultiplexer 320 also includes (i) N output ports each optically coupled to a respective downlink channel 322(1-N) and (ii) an additional N output ports each optically coupled to a respective uplink channel 324(1-N). Multiplexer 327 multiplexes the N downlink channels 323 and the N uplink channels 325 to an output port 328 thereof.

In embodiments, each of optoelectronics 330(k) is a respective optical injecting locking apparatus 100(k), which includes slave laser 130(k). In such embodiments, slave laser 130(k) is optically coupled to comb generator 310 such that tone $T_k$ of optical signal 317 injection locks slave laser 130, such that tone $T_k$ hence corresponds to optical signal 112, FIG. 1. Also in such embodiments, slave laser 130(k) may be directly modulated by downlink data stream 362(k). For example, downlink data stream 362(k) may already be modulated when received by optoelectronics 330(k). Alternatively, each optoelectronics 330(k) may include a respective signal generator 160(k) configured to directly modulate slave laser 130(k) per downlink data stream 362(k).

In embodiments, each of optoelectronics 330(k) is or includes a respective coherent modulator configured to modulate optical tone $T_k$ per one of a quadrature phase-shift keying modulation scheme and quadrature amplitude modulation scheme. In such embodiments, optoelectronics 330 may include a plurality of Mach-Zehnder modulators.

Figure 4:
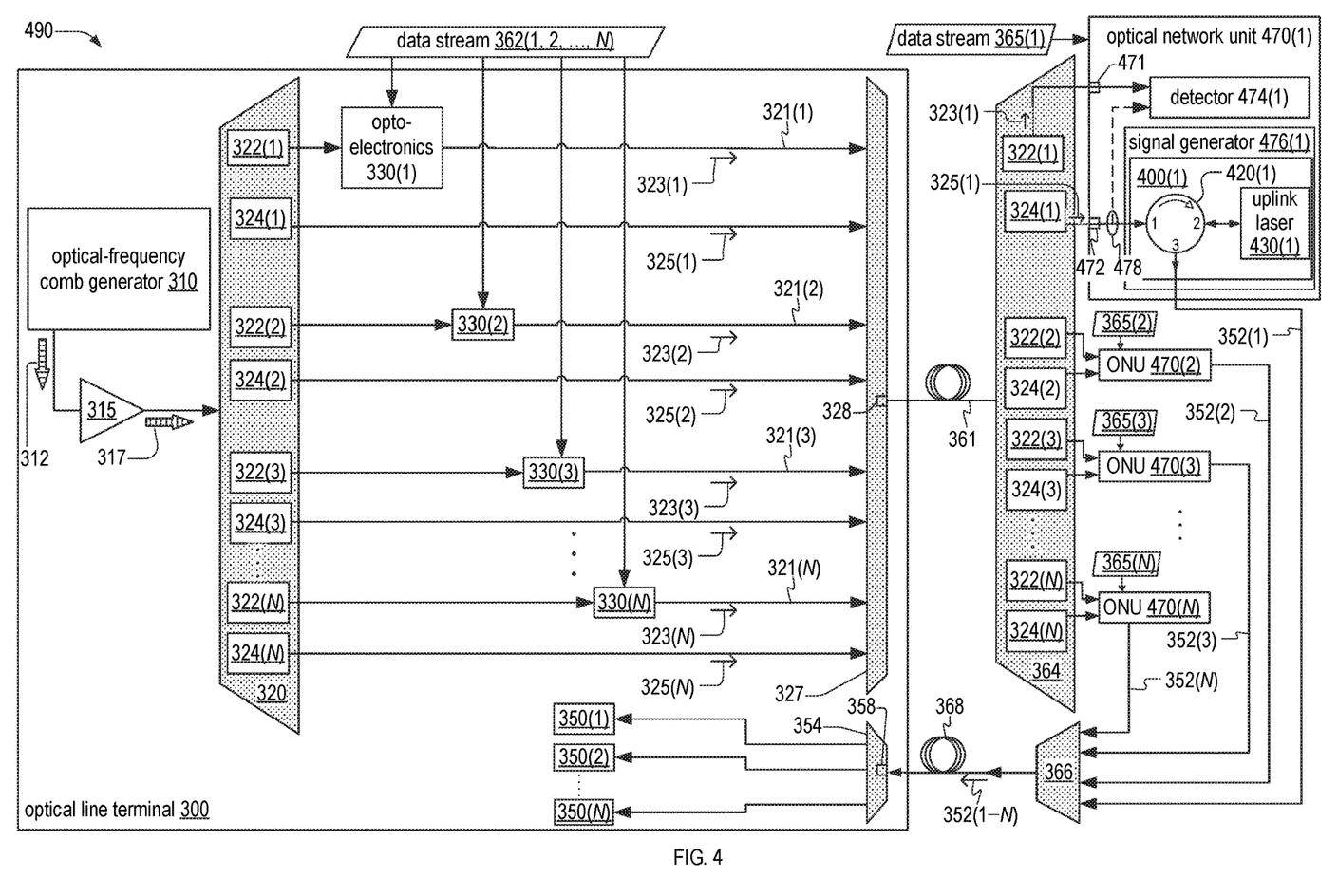
FIG. 4 is a schematic of a passive optical network architecture, which includes the optical line terminal of FIG. 3, in an embodiment.

FIG. 4 is a schematic of a passive optical network architecture 490, which includes an optical line terminal 300, uplink channels 324, and a plurality of optical network units 470(1, 2, . . . , N). Each optical network unit 470(k), denoted by ONU for k>1 in FIG. 4, includes a respective photodetector 474 and an uplink laser 430. Photodetector 474(k) is optically coupled to downlink channel 322(k) and configured to detect downlink signal 323(k). Uplink laser 430(k) is optically coupled to uplink channel 324(k) and configured to be injection locked by uplink carrier 325(k), which corresponds to optical tone $R_k$.

In embodiments, passive optical network architecture 490 includes at least one of a optical fiber 361 and a demultiplexer 364, which optically couple each downlink channel 322(k), 324(k) to its respective optical network unit 470(k). Passive optical network architecture 490 may also include at least one of a multiplexer 366 and an optical fiber 368, which optically couple each optical network unit 470(k) to uplink photodetector 350(k).

Uplink laser 430 is part of a signal generator 476. In embodiments, each signal generator 476 includes a respective OIL apparatus 400, which is an example of OIL apparatus 100, FIG. 1. OIL apparatus 400 includes an optical circulator 420 and one uplink laser 430(k), which are examples of optical circulator 120 and slave laser 130 respectively. In such embodiments, uplink laser 430(k) is optically coupled to comb generator 310 such that uplink carrier 325(k) injection locks uplink laser 430(k). Uplink carrier 325(k) hence corresponds to optical signal 112, FIG. 1, and is received at an input port of optical circulator 420(1). In embodiments, each modulated uplink signal 352(k) is uplink carrier 325(k) modulated with a respective uplink data stream 365(k) received by an optical network unit 470(k) that receives uplink carrier 325(k). Each uplink data stream 365(k) may originate within a respective computing device communicatively connected to optical network unit 470(k). Signal generator 476(k) outputs modulated uplink signal 352(k), which corresponds to output optical signal 132, FIG. 4.

Numerals 1, 2, and 3 in optical circulator 420 denote three consecutive ports p, p+1, and p+2 of optical circulator 420, respectively. When optical circulator 420 is a three-port circulator, p=1 such that numerals 1, 2, and 3 denote the first, second and third ports thereof.

When each of optoelectronics 330(k) is a respective coherent modulator, each photodetector 474(k) is a coherent detector optically coupled to both downlink channel 322(k) and uplink channel 324(k), and configured to receive both downlink signal 323(k) and uplink carrier 325(k).

In embodiments, optical network unit 470 includes a first optical input port 471 and a second optical input port 472, to which downlink channel 322 and uplink channel 324 are respectively coupled, as illustrated in FIG. 4. In such embodiments, photodetector 474 is optically coupled to the first optical port 471, a first port of optical circulator 420 is optically coupled to second optical input port 472, and a second port of optical circulator 420 is optically coupled to uplink laser 430. When photodetector 474 is a coherent detector, photodetector 474 is optically coupled to first optical input port 471 and second optical input port 472, such that uplink carrier 325 functions as a local oscillator. For example, optical network unit 470 may include a fiber beamsplitter 478 such that uplink channel 324 is optically coupled to both the first port of optical circulator 420 and to photodetector 474.

Figure 5:
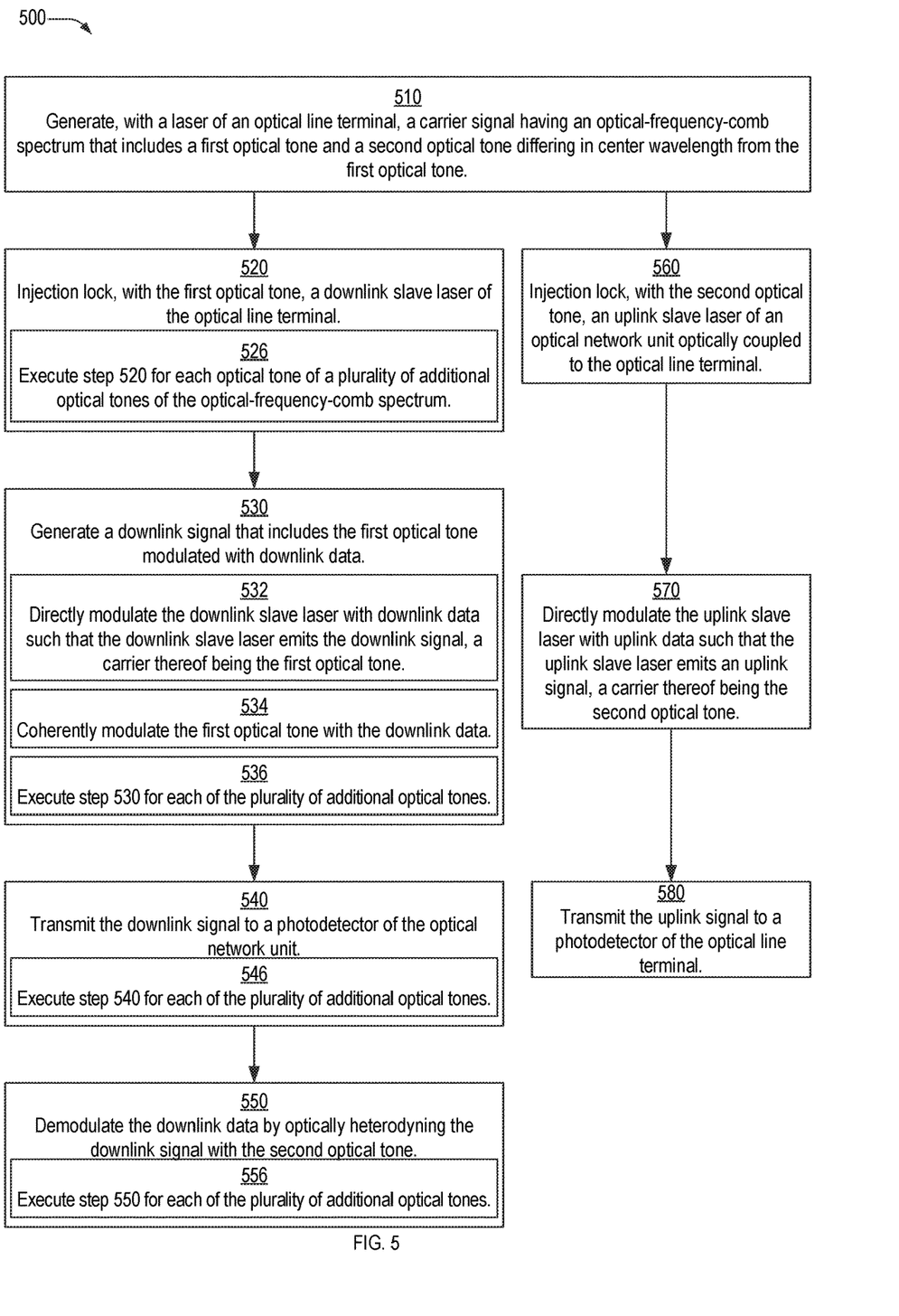
FIG. 5 is a flowchart illustrating a method for transmitting digital information, in an embodiment.

FIG. 5 is a flowchart illustrating a method 500 for transmitting digital information. Method 500 may be implemented within one or more aspects of OLT 300 and of passive optical network architecture 490. Method 500 includes at least one of steps 510, 520, 530, 540, 550, 560, 570, and 580.

Step 510 includes generating, with a laser of an optical line terminal, a carrier signal having an optical-frequency-comb spectrum that includes a first optical tone and a second optical tone differing in center wavelength from the first optical tone. In an example of step 510, optical-frequency comb generator 310 generates carrier signal 312, in which $T_1$ and $R_1$ are examples of the first optical tone and the second optical tone, respectively.

Step 520 includes injection locking, with the first optical tone, a downlink slave laser of the optical line terminal. In an example of step 520, optoelectronics 330(1) of optical line terminal 300 includes slave laser 130, which is injection locked by optical tone $T_1$.

Step 530 includes generating a downlink signal that includes the first optical tone modulated with downlink data. In an example of step 530, optoelectronics 330(1) generates downlink signal 323(1), which is optical tone $T_1$ modulated with downlink data stream 362(1).

Step 530 may include step 532, which includes directly modulating the downlink slave laser with downlink data such that the downlink slave laser emits the downlink signal, a carrier thereof being the first optical tone. In an example of step 532, optoelectronics 330(1) includes slave laser 130, which is directly modulated by downlink data stream 362(1).

Step 530 may include step 534, which includes coherently modulating the first optical tone with the downlink data. In an example of step 534, optoelectronics 330(1) is, or includes, a coherent modulator, which modulates optical tone $T_k$ with downlink data stream 362(1) per one of a quadrature phase-shift keying modulation scheme and quadrature amplitude modulation scheme.

Step 540 includes transmitting the downlink signal to a photodetector of an optical network unit coupled to the optical line terminal. In an example of step 540, optoelectronics 330(1) transmits downlink signal 323(1) to photodetector 474 of optical network unit 470(1) via optical fiber 321(1), multiplexer 327, optical fiber 361, and demultiplexer 364.

Step 550 may apply when optoelectronics 330 includes a coherent modulator and photodetector 474 is includes a coherent detector. Step 550 includes demodulating the downlink data by optically heterodyning the downlink signal with the second optical tone. In an example of step 550, photodetector 474(1) demodulates the downlink data stream 362(1) data by optically heterodyning the downlink signal 323(1) with the optical tone $R_1$ of uplink carrier 325(1).

Steps 560, 570, and 580 pertain to transmitting digital data, within an optical network architecture, from an optical network unit to a photodetector of the optical line terminal Optical network architecture 490, an optical network unit 470, a photodetector 350 are respective examples of the optical network architecture, the optical network unit, the photodetector. Step 560 includes injection locking, with the second optical tone, an uplink slave laser of the optical network unit. In an example of step 560, optical tone $R_1$ of uplink carrier 325(1) injection locks uplink laser 430(1) of optical network unit 470(1).

Step 570 includes directly modulating the uplink slave laser with uplink data such that the uplink slave laser emits an uplink signal, a carrier thereof being the second optical tone. In an example of step 570, uplink laser 430(1) is directly modulated by uplink data stream 365(1) resulting in uplink signal 352(1), a carrier thereof being optical tone $R_1$ of uplink carrier 325(1).

Step 580 includes transmitting the uplink signal to a photodetector of the optical line terminal. In an example of step 580, optical network unit 470(1) transmits uplink signal 352(1) to photodetector 350(1) via multiplexer 366 and optical fiber 368.

Steps 520, 530, 540, and 550 may include respective steps 526, 536, 546, and 556 when the optical-frequency-comb spectrum includes a plurality of additional optical tones. Step 526 includes, for each optical tone of the plurality of additional optical tones, generating a respective downlink signal that includes the optical tone modulated with downlink data. In an example of step 526, for each of k={2, 3, ..., N}, optoelectronics 330(k) of optical line terminal 300 includes a respective slave laser 130, each of which is injection locked by respective optical tone $T_k$.

Step 536 includes, for each optical tone of the plurality of additional optical tones, injection locking, with a reference optical tone of the plurality of optical tones, a respective uplink slave laser of a respective optical network unit optically coupled to the optical line terminal, the reference optical tone differing from the optical tone. In an example of step 536, for each of k={2, 3, ..., N}, optoelectronics 330(k) generates a respective downlink signal 323(k), which is optical tone $T_k$ modulated with downlink data stream 362(k).

Step 546 includes, for each optical tone of the plurality of additional optical tones, transmitting the respective downlink signal to a respective photodetector of the optical network unit. In an example of step 546, for each of k={2, 3, ..., N}, optoelectronics 330(k) transmits downlink signal 323(k) to photodetector 474 of optical network unit 470(k) via optical fiber 321(k), multiplexer 327, optical fiber 361, and demultiplexer 364.

Step 556 includes, for each optical tone of the plurality of additional optical tones, demodulating the downlink data by optically heterodyning the downlink signal with the second optical tone. In an example of step 556, for each of k={2, 3, ..., N}, photodetector 474(k) demodulates downlink data stream 362(k) data by optically heterodyning the downlink signal 323(k) with the optical tone $R_k$ of uplink carrier 325(k).

Changes may be made in the above optical line terminals, passive optical networks, and methods for transmitting digital information without departing from the scope hereof. It should thus be noted that the matter contained in the above description or shown in the accompanying drawings should be interpreted as illustrative and not in a limiting sense. Herein, and unless otherwise indicated, the phrase "in embodiments" is equivalent to the phrase "in certain embodiments," and does not refer to all embodiments. The following claims are intended to cover all generic and specific features described herein, as well as all statements of the scope of the present methods and systems, which, as a matter of language, might be said to fall therebetween.

What is claimed is:

1. An optical line terminal comprising:
    an optical comb generator configured to generate a carrier signal having an optical-frequency-comb spectrum and including N optical tones $T_k$ and N optical tones $R_k$, k={1, 2, ..., N};
    N downlink channels $D_k$, each originating from the optical comb generator and being configured to generate a respective downlink signal $DS_k$ that includes optical tone $T_k$ modulated by downlink data; and
    N uplink-photodetectors $PD_k$ each configured to receive a respective one of a plurality of modulated uplink signals $US_k$, utilizing optical tone $R_k$.

2. The optical line terminal of claim 1, each of the N downlink channels $D_k$ including a respective slave laser $SL_k$ optically coupled to the optical comb generator, the optical comb generator being configured to injection lock slave laser $SL_k$ with optical tone $T_k$.

3. The optical line terminal of claim 2, each slave laser $SL_k$ being one of a Fabry-Perot laser and a vertical cavity surface-emitting laser.

4. The optical line terminal of claim 2, further comprising:
    a demultiplexer having (a) an input port optically coupled to the optical comb generator, and (b) N downlink output ports optically coupled to a respective downlink channel $D_k$ such that each slave laser $SL_k$ is externally injected by optical tone $T_k$.

5. The optical line terminal of claim 2, each downlink channel $D_k$ including a respective signal generator $M_k$ configured to generate downlink signal $DS_k$ by directly modulating slave laser $SL_k$ with the downlink data.

6. The optical line terminal of claim 1, each of the N downlink channels $D_k$ including a respective modulator $M_k$, each modulator $M_k$ being a coherent optical modulator configured to modulate optical tone $T_k$ per one of a quadrature phase-shift keying modulation scheme and quadrature amplitude modulation scheme.

7. The optical line terminal of claim 6, the coherent optical modulator including a plurality of Mach-Zehnder modulators.

8. The optical line terminal of claim 1, the optical comb generator including a slave laser and a tunable laser optically coupled to and configured to injection lock the slave laser, the slave laser being one of a Fabry-Perot laser and a vertical cavity surface-emitting laser.

9. The optical line terminal of claim 1, further comprising:
    a multiplexer having N downlink input ports each optically coupled to a respective downlink channel $D_k$; and
    a demultiplexer having (a) an input port configured to receive the plurality of modulated uplink signals $US_k$, and (b) N output ports each optically coupled to a respective one of the N uplink-photodetectors $PD_k$.

10. A passive optical network comprising:
    the optical line terminal of claim 1;
    N uplink channels $U_k$ each optically coupled to the optical comb generator such that optical tone $R_k$ propagates in uplink channel $U_k$; and
    N optical network units $ONU_k$, each optical network unit $ONU_k$ including a downlink-photodetector optically coupled to downlink channel $D_k$ and configured to detect downlink signal $DS_k$; and
    an uplink laser $UL_k$ optically coupled to uplink channel $U_k$ and configured to be injection locked by optical tone $R_k$.

11. The passive optical network of claim 10, each optical network unit $ONU_k$ further including:
    an optical circulator having a first port optically coupled to uplink channel $U_k$ and configured to receive optical tone $R_k$, a second port optically coupled to uplink laser $UL_k$, and a third port optically coupled to uplink-photodetector $PD_k$.

12. The passive optical network of claim 10, the downlink-photodetector being a coherent detector optically coupled to both downlink channel $D_k$ and uplink channel $U_k$, and configured to receive both downlink signal $DS_k$ and optical tone $R_k$.

13. A method for transmitting digital information comprising:

generating, with a laser of an optical line terminal, a carrier signal having an optical-frequency-comb spectrum that includes a first optical tone and a second optical tone differing in center wavelength from the first optical tone;

generating a downlink signal that includes the first optical tone modulated with downlink data;

injection locking, with the second optical tone, an uplink slave laser of an optical network unit optically coupled to the optical line terminal; and transmitting the downlink signal to a photodetector of the optical network unit.

14. The method of claim 13, further comprising:

injection locking, with the first optical tone, a downlink slave laser of the optical line terminal;

wherein generating the downlink signal comprises directly modulating the downlink slave laser with downlink data such that the downlink slave laser emits the downlink signal, a carrier thereof being the first optical tone.

15. The method of claim 13, further comprising:

directly modulating the uplink slave laser with uplink data such that the uplink slave laser emits an uplink signal, a carrier thereof being the second optical tone; and transmitting the uplink signal to a photodetector of the optical line terminal.

16. The method of claim 13, in the step of generating the carrier signal, the laser being an injection-locked optical comb generator; and generating the downlink signal comprising coherently modulating the first optical tone with the downlink data.

17. The method of claim 16, further comprising demodulating the downlink data by optically heterodyning the downlink signal with the second optical tone.

18. The method of claim 13, the optical-frequency-comb spectrum including a plurality of additional optical tones, and further comprising, for each optical tone of the plurality of additional optical tones:

generating a respective downlink signal that includes the optical tone modulated with downlink data;

injection locking, with a reference optical tone of the plurality of optical tones, a respective uplink slave laser of a respective optical network unit optically coupled to the optical line terminal, the reference optical tone differing from the optical tone; and transmitting the respective downlink signal to a respective photodetector of the optical network unit.

* * * * *